United States Patent
Mun et al.

(10) Patent No.: US 12,532,773 B2
(45) Date of Patent: Jan. 20, 2026

(54) DISPLAY DEVICE

(71) Applicant: SAMSUNG DISPLAY CO., LTD., Yongin-si (KR)

(72) Inventors: Sungjin Mun, Hwaseong-si (KR); Kwanhee Lee, Suwon-si (KR); Jae Young Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 314 days.

(21) Appl. No.: 17/229,878

(22) Filed: Apr. 14, 2021

(65) Prior Publication Data
US 2022/0077224 A1    Mar. 10, 2022

(30) Foreign Application Priority Data

Sep. 7, 2020 (KR) .................. 10-2020-0113848

(51) Int. Cl.
| | |
|---|---|
| *H01L 25/16* | (2023.01) |
| *H10H 20/831* | (2025.01) |
| *H10H 20/857* | (2025.01) |
| *H10H 29/14* | (2025.01) |
| *H10K 59/131* | (2023.01) |

(52) U.S. Cl.
CPC ....... *H01L 25/167* (2013.01); *H10H 20/8312* (2025.01); *H10H 20/857* (2025.01); *H10H 29/142* (2025.01); *H10K 59/131* (2023.02)

(58) Field of Classification Search
CPC .............. H01L 25/167; H10H 20/8312; H10H 20/857; H10H 29/142; H10K 59/131; H10K 59/121; H10K 59/123; H10K 59/35; H10K 2102/3026; H10K 59/128; G09G 3/3208
See application file for complete search history.

(56) References Cited

U.S. PATENT DOCUMENTS

| | | |
|---|---|---|
| 7,786,669 B2 | 8/2010 | Park |
| 8,395,569 B2 | 3/2013 | Min et al. |
| 2004/0031959 A1* | 2/2004 | Park ............... H10K 59/127 257/40 |
| 2018/0212014 A1* | 7/2018 | Choi .............. H10K 59/1216 |
| 2019/0319020 A1* | 10/2019 | Pan ................. H01L 25/167 |
| 2020/0052033 A1* | 2/2020 | Iguchi ............. H01L 27/156 |
| 2020/0395403 A1* | 12/2020 | Ahmed ................ G09F 9/33 |
| 2020/0411491 A1* | 12/2020 | Ahmed ............. H01L 33/502 |

FOREIGN PATENT DOCUMENTS

| | | |
|---|---|---|
| KR | 10-2004-0015935 | 2/2004 |
| KR | 10-2008-0054626 | 6/2008 |
| KR | 10-1157262 | 6/2012 |
| KR | 10-1365779 | 2/2014 |
| KR | 10-1608965 | 4/2016 |

OTHER PUBLICATIONS

Korean Office Action with English translation for Korean Patent Application or Patent No. 10-2020-0113848, dated Dec. 11, 2024.

* cited by examiner

*Primary Examiner* — Su C Kim
(74) *Attorney, Agent, or Firm* — Sughrue Mion, PLLC

(57) ABSTRACT

A display device includes a first substrate including a first substrate, a first connection electrode disposed on the first substrate, and connected to a first transistor, a first spacer disposed on the first connection electrode, and including a conductive material, a first light emitting element disposed on the first spacer, and a second light emitting element disposed on the first substrate, and connected to a second transistor.

18 Claims, 8 Drawing Sheets

DISPLAY DEVICE

CROSS-REFERENCE TO RELATED APPLICATION

This application claims priority from and the benefit of Korean Patent Application No. 10-2020-0113848, filed on Sep. 7, 2020 which is hereby incorporated by reference for all purposes as if fully set forth herein.

BACKGROUND

Field

Embodiments of the invention relate generally to a display device, and more particularly to a display device that includes a plurality of pixels.

Discussion of the Background

A display device may include a plurality of pixels. The pixels may include a light emitting element. For example, the light emitting element may include an organic light emitting diode, a quantum-dot light emitting diode, a quantum-dot nano light emitting diode, and the like.

The display device may display an image to a user through the pixels. The display device may display a high-resolution image by disposing more pixels within the same display area of the display device.

The light emitting elements may be partitioned by a pixel defining layer. However, as the pixel defining layer is formed, the plurality of pixels must be spaced apart by the pixel defining layer. The above information disclosed in this Background section is only for understanding of the background of the inventive features to be described in detail hereinbelow, and, therefore, it may contain information that does not constitute prior art.

SUMMARY

Applicant realized a high-resolution image cannot be readily be achieved particularly when the viewing of a small display, such as cell phone display by a cell phone user, due to the spatial constraints of arranging the plurality of pixels in a conventional manner.

Display devices constructed according to the principles and illustrative implementations of the invention are capable of displaying high-resolution images even if a display device is of a relatively small size, such as a display of a smart phone. For example, high resolution images may be achievable by having a first light emitting element that is disposed above but adjacent to a second light emitting element, in which the first and second light emitting elements may emit light or substantially the same color or of different colors (e.g., R and B, or R and G, or B and G), to thereby enable the light emitting elements to be more densely packed and to display a high-resolution image, even if the display device is of a relatively small size, such as a display or a smart phone or the like. In a similar manner, a first and second light emitting elements may be disposed above a third light emitting element, in which each light emitting element may emit light of a same color or a light of a different color (e.g., R, G, B), and in which the first, second and third light emitting elements are positioned adjacent to each other in the display device, to thereby enable the light emitting elements to be more densely packed and to display a high-resolution image. More specifically, according to one embodiment, the display device includes a plurality of light emitting elements, a first substrate, and a second substrate opposing and spaced apart from the first substrate by a spacer. Some of the light emitting elements may be disposed on the first substrate, and the rest of the light emitting elements may be disposed on a surface of the second substrate facing the first substrate. Since the pixel defining layer for partitioning pixels from each other does not need to be disposed between all of the light emitting, the light emitting elements may be densely spaced in a plan view. Accordingly, the display device may display a high-resolution image, even if the display area is small, like that of a cell phone.

The first light emitting element may include: a lower electrode disposed on the first support; an intermediate layer disposed on the lower electrode; and an upper electrode disposed on the intermediate electrode.

The first substrate may further include a third transistor connected to a third light emitting element disposed on the first substrate.

The first support may comprise a spacer.

The first to third light emitting elements may emit light of different colors and each of the second light emitting element and the third light emitting element may comprise: a lower electrode disposed on the first substrate; an intermediate layer disposed on the lower electrode; and an upper electrode disposed on the intermediate layer.

The first to third light emitting elements may be of a top emission type.

The first connection electrode and the first light emitting element may be electrically connected to each other via the first support.

The display device may further comprise a second substrate on which the first light emitting element is disposed.

The first substrate may further include a third transistor connected to a second connection electrode disposed on the first substrate, a second support disposed on the second connection electrode and including a conductive material, and a third light emitting element disposed on the second support.

The first substrate may further include a fourth transistor connected to a fourth light emitting element disposed on the first substrate.

The first light emitting element and the third light emitting element may be disposed in a first elevational plane and spaced apart from each other by the second light emitting element, and the second light emitting element and the fourth light emitting element may be disposed in a second elevational plane different from the first elevational plane, and spaced apart from each other by the third light emitting element.

The first light emitting element and the third light emitting element may emit light of substantially the same color, and the first light emitting element, the second light emitting element, and the fourth light emitting element may emit light of different color from each other.

The first to fourth light emitting elements may be of a top emission type.

According to another embodiment, a display device includes a first substrate including a first transistor, a second transistor, and a third transistor, a first connection electrode disposed on the first substrate, and connected to the first transistor, a first support disposed on the first connection electrode, and including a conductive material, a first light emitting element disposed on the first spacer, a second connection electrode disposed on the first substrate, and connected to the second transistor, a second support disposed on the second connection electrode, and including a conductive material, a second light emitting element disposed on the second spacer, and a third light emitting element disposed on the first substrate, and connected to the third transistor.

The first to third light emitting elements may emit light of different colors.

The display device may further include a second substrate disposed on the first light emitting element and the second light emitting element.

The first connection electrode and the second connection electrode may be spaced apart from each other by the third light emitting element.

The first connection electrode and the third light emitting element may be spaced apart from each other by the second connection electrode.

The first to third light emitting elements may be of a top emission type.

The first connection electrode, the first spacer, and the first light emitting element may be electrically connected, and the second connection electrode, the second spacer, and the second light emitting element may be electrically connected.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
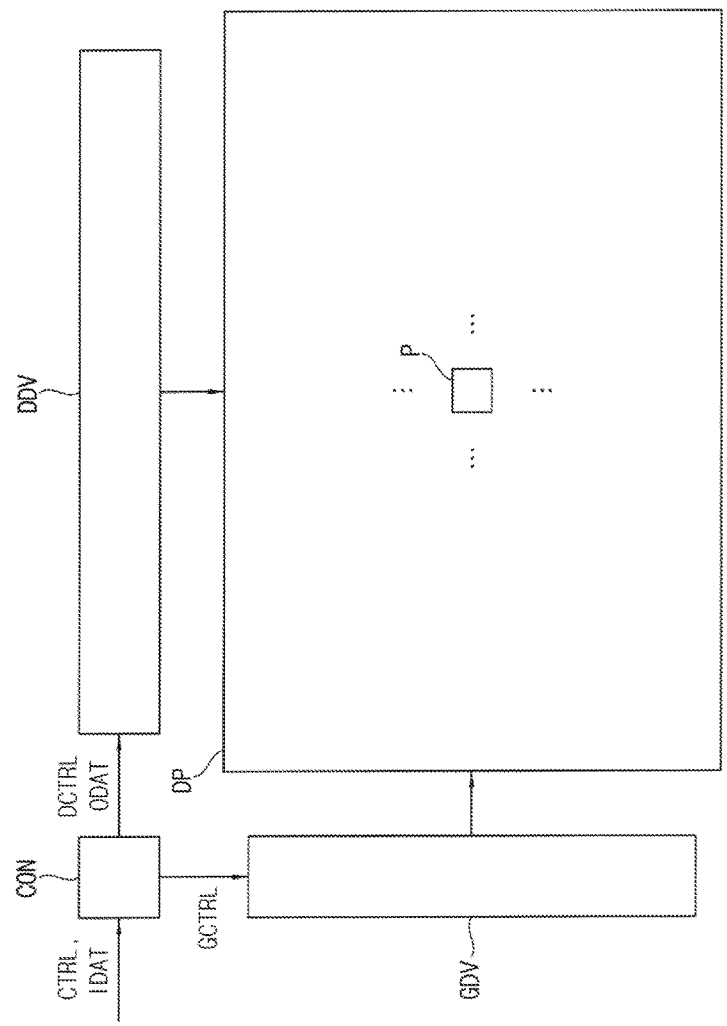
FIG. 1 is a plan view of an embodiment of a display device constructed according to the principles of the embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive features.

Unless otherwise specified, the illustrated embodiments are to be understood as providing illustrative features of varying detail of some ways in which the inventive features may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side"

(e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a plan view of an embodiment of a display device constructed according to the principles of the embodiment.

Referring to FIG. 1, the display device may include a display panel DP, a data driver DDV, a gate driver GDV, and a timing controller CON.

In embodiments described in more detail hereinbelow, the display panel DP may be integrally formed. Alternatively, in embodiments, the display panel DP may include a plurality of sub-display panels.

The display panel DP may include a plurality of pixels P. Each of the plurality of pixels P may include light emitting elements. The display panel DP may display an image through the light emitting elements. For example, the light emitting elements may include any one of an organic light emitting diode, a quantum-dot organic light emitting diode, and a quantum-dot nano light emitting diode. Alternatively, the display device may include a liquid crystal display device or other known display technology.

The timing controller CON may generate a gate control signal GCTRL, a data control signal DCTRL, and output image data ODAT based on a control signal CTRL and input image data IDAT externally provided to the timing controller CON. For example, the control signal CTRL may include a vertical synchronization signal, a horizontal synchronization signal, an input data enable signal, a master clock signal, and the like. For example, the input image data IDAT may be RGB data including red (R) image data, green (G) image data, and blue (B) image data. Alternatively, the input image data IDAT may include magenta image data, cyan image data, and yellow image data.

The gate driver GDV may generate gate signals based on the gate control signal GCTRL provided from the timing controller CON. For example, the gate control signal GCTRL may include a vertical start signal and a clock signal.

The gate driver GDV is electrically connected to the display panel DP, and may sequentially output the gate signals. Each of the pixels P may receive a data voltage according to the control of each of the gate signals.

The data driver DDV may generate the data voltage based on the data control signal DCTRL and the output image data ODAT provided from the timing controller CON. For example, the data control signal DCTRL may include an output data enable signal, a horizontal start signal, and a load signal.

The data driver DDV is electrically connected to the display panel DP and may generate a plurality of data voltages. Each of the pixels P may display an image by receiving a signal for luminance corresponding to each of the data voltages.

Figure 2:
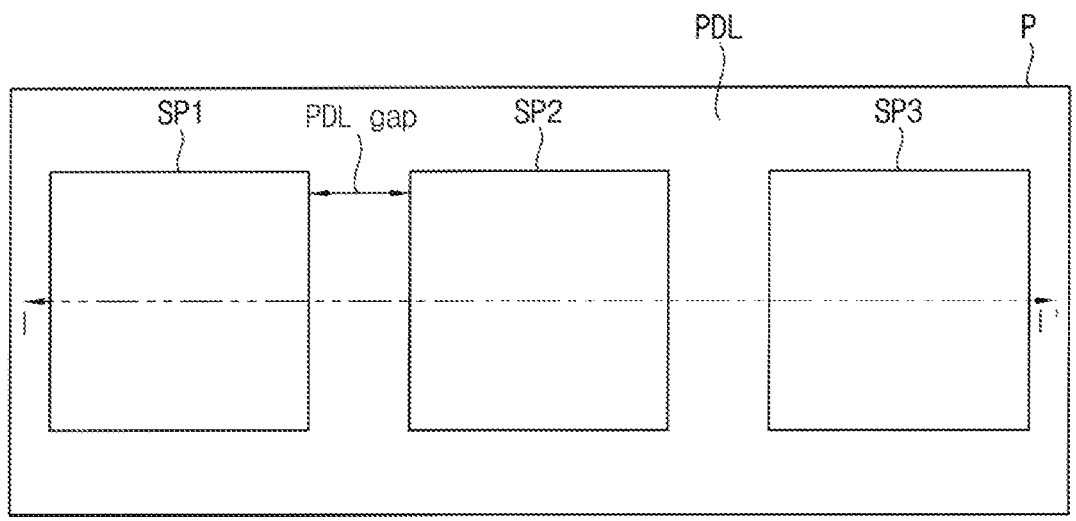
FIG. 2 is a diagram schematically illustrating an embodiment of pixels included in the display device of FIG. 1.

FIG. 2 is a diagram schematically illustrating an embodiment of pixels included in the display device of FIG. 1.

Referring to FIG. 2, each of the plurality of pixels P may include a plurality of sub-pixels. In an embodiment, each of the plurality of pixels P may include a first sub-pixel SP1, a second sub-pixel SP2, and a third sub-pixel SP3. The first sub-pixel SP1, the second sub-pixel SP2, and the third sub-pixel SP3 may emit light of different colors. The first sub-pixel SP1, the second sub-pixel SP2, and the third sub-pixel SP3 may be partitioned from each other by a pixel defining layer PDL.

In embodiments, the sub-pixels SP1, SP2, and SP3 may be arranged in various ways. For example, the sub-pixels SP1, SP2, and SP3 may be spaced apart in one direction as illustrated in FIG. 2. Alternatively, the sub-pixels SP1, SP2, and SP3 may be arranged in a diamond, pentile, or S-strip structure. That is, the sub-pixels SP1, SP2, and SP3 may be variously arranged within a range in which an image may be displayed.

The first sub-pixel SP1, the second sub-pixel SP2, and the third sub-pixel SP3 may include different materials. The different materials may be deposited by vapor deposition. In this case, a material to be deposited in the first sub-pixel SP1 may be deposited in the adjacent second sub-pixel SP2. In this case, the light emitting characteristics of the display device may become deteriorated. To prevent this from occurring, the first sub-pixel SP1, the second sub-pixel SP2, and the third sub-pixel SP3 should be spaced apart by a predetermined interval or more by a pixel defining layer PDL. In addition, the plurality of pixels P should also be spaced apart from each other by a predetermined interval or more. However, when the first sub-pixel SP1, the second sub-pixel SP2, and the third sub-pixel SP3 are spaced apart from each other by a predetermined interval or more, the display device may not be able to display a high-resolution image.

Figure 3:
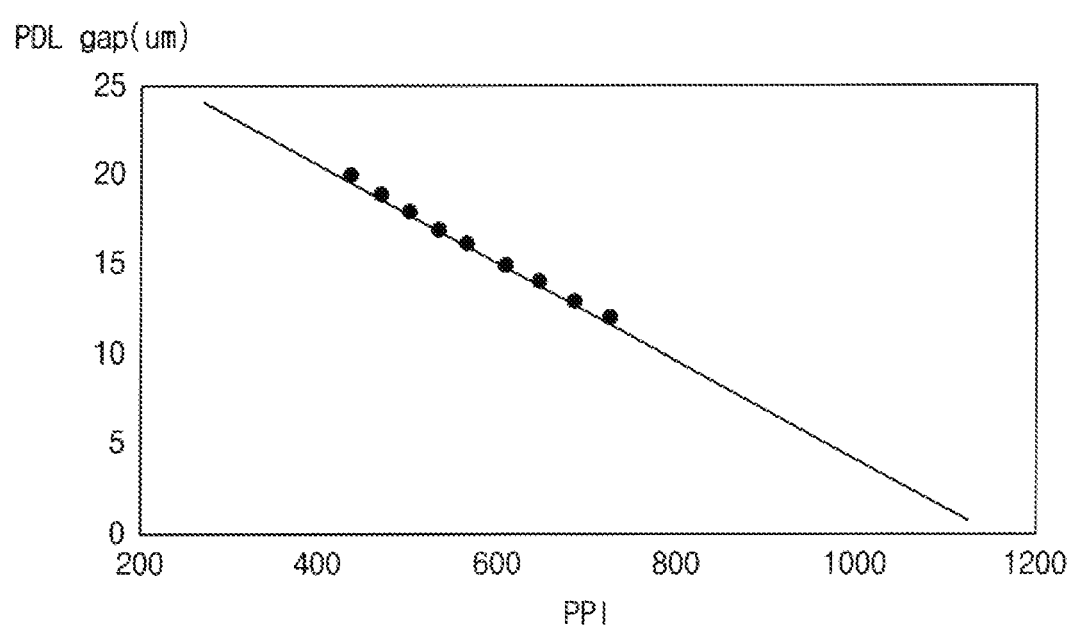
FIG. 3 is a graph illustrating the distance between a number of pixels per inch and the width of a pixel defining layer disposed between the pixels.

FIG. 3 is a graph illustrating the distance between a number of pixels per inch and the width of a pixel defining layer disposed between the pixels.

Referring to FIG. 3, in order to increase the number of pixels per inch (PPI) of the display device, the space between the plurality of pixels and sub-pixels should be reduced. That is, the width (PDL gap) of the pixel defining layer disposed between the plurality of pixels and between sub-pixels should be reduced.

For example, a display device currently used may include about 400 to 600 pixels per inch (400 to 600 PPI). In this case, the width of the pixel defining layer disposed between the pixels may be about 10 to 20 μm. In order for the display device to display a high-resolution image (PPI>1000), the width (PDL gap) should be reduced to about 5 μm or less.

Figure 4:
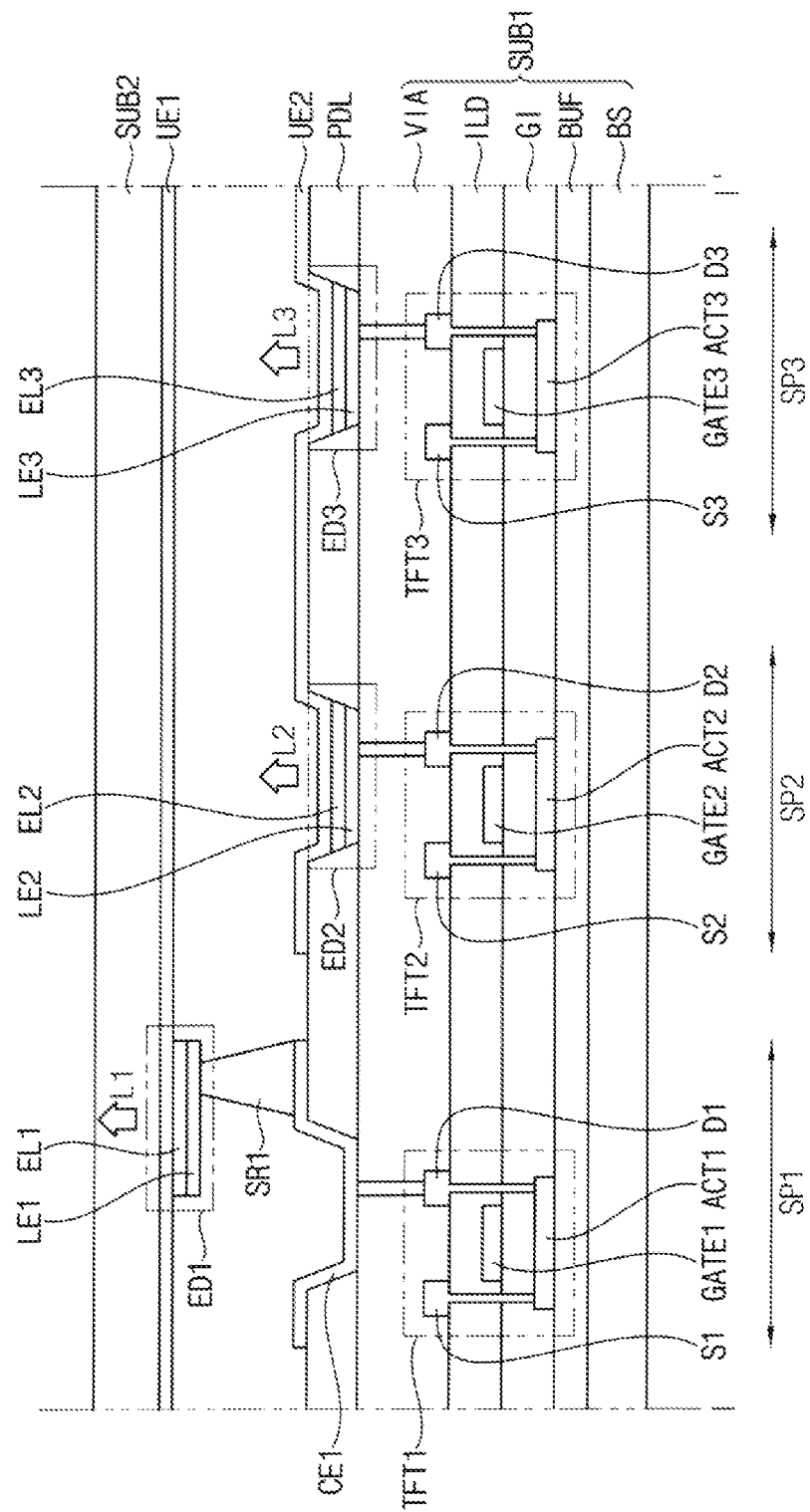
FIG. 4 is a cross-sectional view illustrating an embodiment taken along the line I-I' of FIG. 2.

FIG. 4 is a cross-sectional view illustrating an embodiment taken along the line I-I' of FIG. 2.

Referring to FIG. 4, the display device may include a first substrate SUB1, a second substrate SUB2, a first light emitting element ED1, a second light emitting element ED2, a third light emitting element ED3, a pixel defining layer PDL, a first connection electrode CE1 and a first support that may be in the form of a first spacer SR1. The light emitting element may be any known element that can selectively emit light of different intensity when activated by an electronic signal.

The first substrate SUB1 may include a base substrate BS, a buffer layer BUF, a gate insulating layer GI, an interlayer insulating layer ILD, a via insulating layer VIA, a first transistor TFT1, a second transistor TFT2 and a third transistor TFT3. The first transistor TFT1 may include a first active layer ACT1, a first gate electrode GATE1, a first source electrode S1, and a first drain electrode D1. The second transistor TFT2 may include a second active layer ACT2, a second gate electrode GATE2, a second source electrode S2, and a second drain electrode D2. The third transistor TFT3 may include a third active layer ACT3, a third gate electrode GATE3, a third source electrode S3, and a third drain electrode D3.

The base substrate BS may include glass, quartz, plastic, or the like. In embodiments, the base substrate BS may include plastic, and thus the display device may have a flexible characteristic. In this case, the base substrate BS may have a structure in which at least one organic film layer and at least one barrier layer are alternately stacked. For example, the organic film layer may be formed using an organic material such as polyimide, and the barrier layer may be formed using an inorganic material.

The buffer layer BUF may be disposed on the base substrate BS. The buffer layer BUF may prevent diffusion of metal atoms or impurities from the base substrate BS to the first to third active layers ACT1, ACT2, and ACT3. In addition, the buffer layer BUF may adjust a heat supply rate during a crystallization process for forming the first to third active layers ACT1, ACT2, and ACT3, and accordingly, the first to third active layers ACT1, ACT2, and ACT3 may be uniformly formed.

The first to third active layers ACT1, ACT2, and ACT3 may be disposed on the buffer layer BUF. In embodiments, the first to third active layers ACT1, ACT2, and ACT3 may include an oxide-based semiconductor material. For example, the oxide-based semiconductor material may include at least on selected from zinc oxide ("ZnOx"), tin oxide ("SnOx"), indium oxide ("InOx"), indium-zinc oxide ("IZO"), indium-gallium oxide ("IGO"), zinc-tin oxide ("ZnSnxOy"), and indium-gallium-zinc oxide ("IGZO").

Alternatively, in embodiments, the first to third active layers ACT1, ACT2, and ACT3 may include a silicon-based semiconductor material. For example, the silicon-based semiconductor material may include amorphous silicon or polycrystalline silicon.

Alternatively, in embodiments, some of the first to third active layers ACT1, ACT2, and ACT3 may include a silicon-based semiconductor material, and others of the first to third active layers except for the some may include an oxide-based semiconductor material. In this case, the some and the others of the first to third active layers may be disposed on different layers.

The gate insulating layer GI may be disposed on the buffer layer BUF to cover the first to third active layers ACT1, ACT2, and ACT3. The gate insulating layer GI may include silicon oxide ("SiOx"), silicon nitride ("SiNx"), silicon oxynitride ("SiNxOy"), or the like.

The gate insulating layer GI may be disposed to have a flat top surface. However, in embodiments, the gate insulating layer GI may be disposed to have substantially a same thickness along the profiles of the first to third active layers ACT1, ACT2, and ACT3. This may be applied equally to the insulating layer described below.

The first to third gate electrodes GATE1, GATE2, and GATE3 may be disposed on the gate insulating layer GI. The first to third gate electrodes GATE1, GATE2, and GATE3 may include a conductive material. For example, the first to third gate electrodes GATE1, GATE2, and GATE3 may include a metal, an alloy, a conductive metal oxide, a transparent conductive material, and the like. For example, the first to third gate electrodes GATE1, GATE2, and GATE3 may include silver ("Ag"), an alloy containing silver, molybdenum ("Mo"), an alloy containing molybdenum, aluminum ("Al"), alloys containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), Tantalum ("Ta"), platinum ("Pt"), scandium ("Sc"), indium tin oxide ("ITO"), indium zinc oxide ("IZO"), and the like.

The interlayer insulating layer ILD may be disposed on the gate insulating layer GI while covering the first to third gate electrodes GATE1, GATE2, and GATE3. The interlayer insulating layer ILD may include a silicon compound, a metal oxide, or the like. For example, the interlayer insulating layer ILD may include silicon oxide ("SiOx"), silicon nitride ("SiNx"), silicon oxynitride ("SiNxOy"), or the like.

The first to third source electrodes S1, S2, and S3 and the first to third drain electrodes D1, D2, and D3 may be disposed on the interlayer insulating layer ILD. The first to third source electrodes S1, S2, S3 and the first to third drain electrodes D1, D2, D3 may include a metal, an alloy, a conductive metal oxide, a transparent conductive material, and the like.

Each of the first source electrode S1 and the first drain electrode D1 may be connected to the first active layer ACT1 through a contact hole. Each of the second source electrode S2 and the second drain electrode D2 may be connected to the second active layer ACT2 through a contact hole. Each of the third source electrode S3 and the third drain electrode D3 may be connected to the third active layer ACT3 through a contact hole.

The via insulating layer VIA may be disposed on the interlayer insulating layer while covering the first to third source electrodes S1, S2, S3 and the first to third drain electrodes D1, D2, D3. The via insulating layer VIA may include a silicon compound, a metal oxide, or the like. Alternatively, the via insulating layer VIA may be formed of an organic insulating material such as polyimide ("PI").

The pixel defining layer PDL may be disposed on the via insulating layer VIA. The pixel defining layer PDL may include openings in which the first connection electrode CE1, the second light emitting element ED2, and the third light emitting element ED3 are disposed. In embodiments, the pixel defining layer PDL may include an organic insulating material. For example, the pixel defining layer PDL may include an organic insulating material such as polyimide ("PI") or hexamethyldisiloxane.

The first connection electrode CE1 may be disposed in an opening formed by the pixel defining layer PDL. The first connection electrode CE1 may include a metal, an alloy, a conductive metal oxide, a transparent conductive material, or the like. The first connection electrode CE1 may be connected to the first drain electrode D1 of the first transistor TFT1 through a contact hole. The first connection electrode CE1 may receive a signal from the first transistor TFT1.

The second light emitting element ED2 and the third light emitting element ED3 may be disposed in an opening formed by the pixel defining layer PDL. The second light emitting element ED2 and the third light emitting element ED3 may be disposed on a same layer as the first connection electrode CE1. The second light emitting element ED2 may include a second lower electrode LE2, a second intermediate layer EL2, and a second upper electrode UE2. The third light emitting element ED3 may include a third lower electrode LE3, a second intermediate layer EL3, and a second upper electrode UE2. The second upper electrode UE2 may be disposed on the pixel defining layer PDL, the second intermediate layer EL2, and the third intermediate layer EL3. The second lower electrode LE2 may be connected to the second drain electrode D2 of the second transistor TFT2 through a contact hole. The third lower electrode LE3 may be connected to the third drain electrode D3 of the third transistor TFT3 through a contact hole. Through this, the second light emitting element ED2 and the third light emitting element ED3 may directly receive signals from the second transistor TFT2 and the third transistor TFT3, respectively.

The first spacer SR1 may be disposed on the first connection electrode CE1. The first spacer SR1 may include a conductive material. For example, the first spacer SR1 may include a metal, an alloy, a conductive metal oxide, a transparent conductive material, or the like. The spacers disclosed herein may be any element or structure that supports the second substrate SUB2 and enables one of more of the light emitting elements to be disposed in a different elevational plane than the remaining light emitting elements.

The area between the first upper electrode UE1 and the second upper electrode UE2 created by the spacer SR1 may be filled with various materials. In embodiments, the area between the first upper electrode UE1 and the second upper electrode UE2 may be filled with a transparent insulating material. The transparent insulating material may include glass, transparent resin, or the like. For example, the transparent insulating material may include polyimide ("PI"), polyethylene terephthalate ("PET"), polyethylene naphthalate ("PEN"), and the like. Alternatively, the area between the first upper electrode UE1 and the second upper electrode UE2 may be filled with a transparent adhesive material. For example, the transparent adhesive material may be an acrylic adhesive material. The transparent adhesive material may include an optically transparent resin, an optically transparent adhesive, and the like. However, in embodiments, the space between the first upper electrode UE1 and the second upper electrode UE2 may be filled with air. The first light emitting element ED1 may be disposed on the first spacer SR1. The first light emitting element ED1 may include a first lower electrode LE1, a first intermediate layer ELL and a first upper electrode UE1. The first lower electrode LE1 may be connected to the first connection electrode CE1 and the first transistor TFT1 through the first spacer SR1. Through this, the first light emitting element ED1 may receive a signal from the first transistor TFT1.

In this way, the first light emitting element ED1 is disposed above the second light emitting element ED2 and the third light emitting element ED3, when the first light emitting element ED1 is deposited, materials included in the first light emitting element ED1 are not deposited in the openings in which the second light emitting element ED2 and the third light emitting element ED3 are disposed. That is, the first light emitting element ED1 may be positioned adjacent to the second light emitting element ED2 and the third light emitting element ED3 and closer to each other than if all the light emitting elements were disposed in the same elevational plane. Accordingly, the display device may display a high-resolution image.

The second substrate SUB2 may be disposed on the first upper electrode UE1. In embodiments, the first light emitting element ED1, the second light emitting element ED2, and the third light emitting element ED3 may be of a top emission type emitting light in a direction in which the second substrate SUB2 is disposed. Accordingly, the second substrate SUB2 may include a transparent material. For example, the second substrate SUB2 may be a transparent substrate such as a glass substrate or a plastic substrate.

The first light emitting element ED1 may emit a first light L1, and the second light emitting element ED2 may emit a second light L2. The third light emitting element ED3 may emit a third light L3. Each of the first to third lights L1, L2, and L3 may have different colors.

In embodiments, in the first sub-pixel SP1, the first light emitting element ED1 may be connected to the first transistor TFT1 to emit the first light L1. In the second sub-pixel SP2, the second light emitting element ED2 may be connected to the second transistor TFT2 to emit the second light L2. In the third sub-pixel SP3, the third light emitting element ED3 is connected to the third transistor TFT3 to emit the third light L3.

Figure 5:
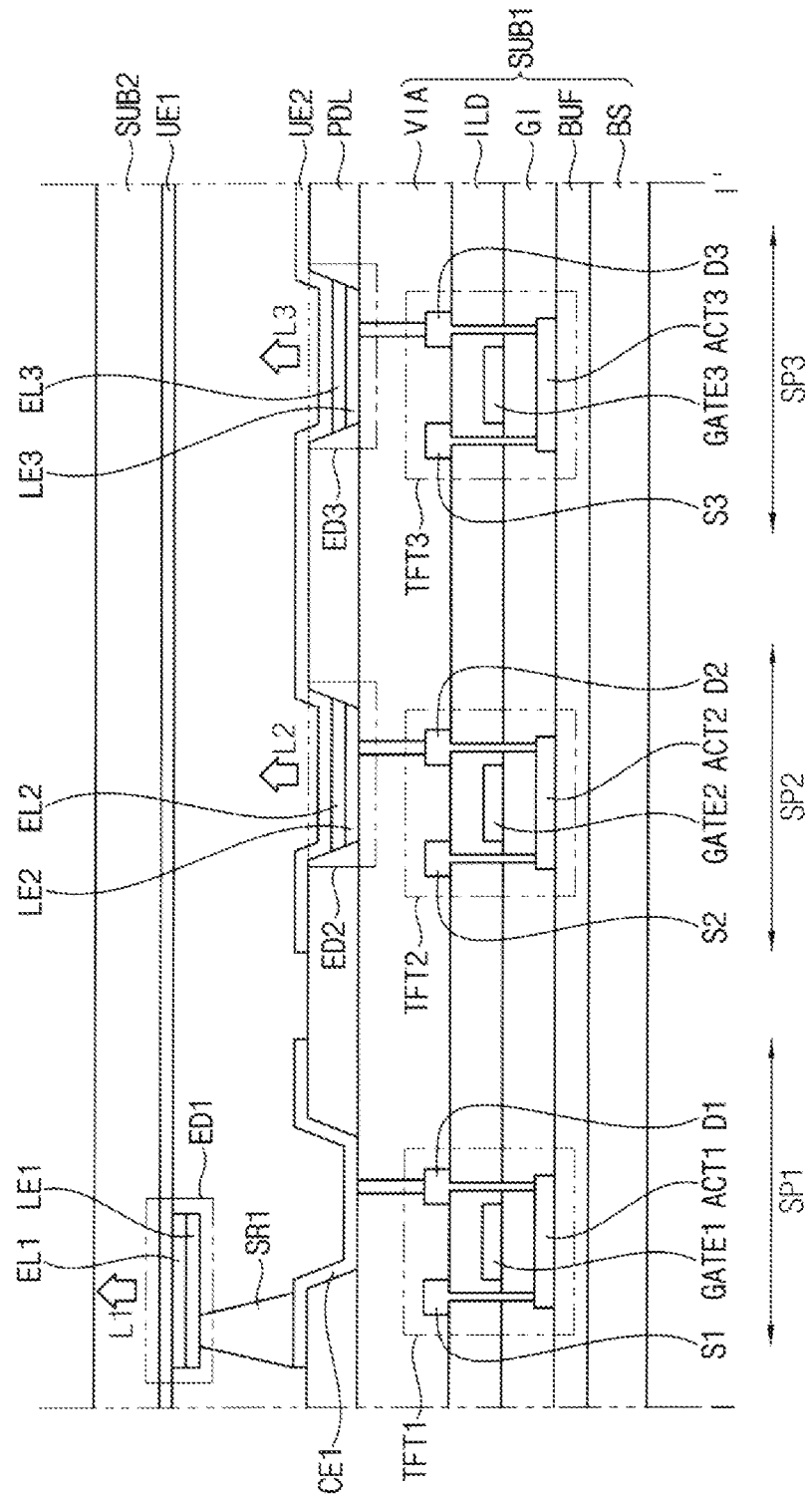
FIG. 5 is a cross-sectional view illustrating an embodiment taken along the line I-I' of FIG. 2.

FIG. 5 is a cross-sectional view illustrating an embodiment taken along the line I-I' of FIG. 2. FIG. 5 may be substantially the same as FIG. 4 except that the position of the first spacer SR1 is changed. Accordingly, repetitive descriptions will be omitted to avoid redundancy.

Referring to FIG. 5, the first spacer SR1 may be disposed on the first connection electrode CE1. Unlike the first spacer SR1 of FIG. 4 disposed on one end of the first connection electrode CE1, the first spacer SR1 of FIG. 5 may be disposed on the other end of the first connection electrode CE1 opposite to the one end. As described above, the first spacer SR1 may be variously disposed within a range capable of contacting the first connection electrode CE1. Accordingly, the first spacer SR1 may support the second substrate SUB2 at various positions on the first substrate SUB1.

Figure 6:
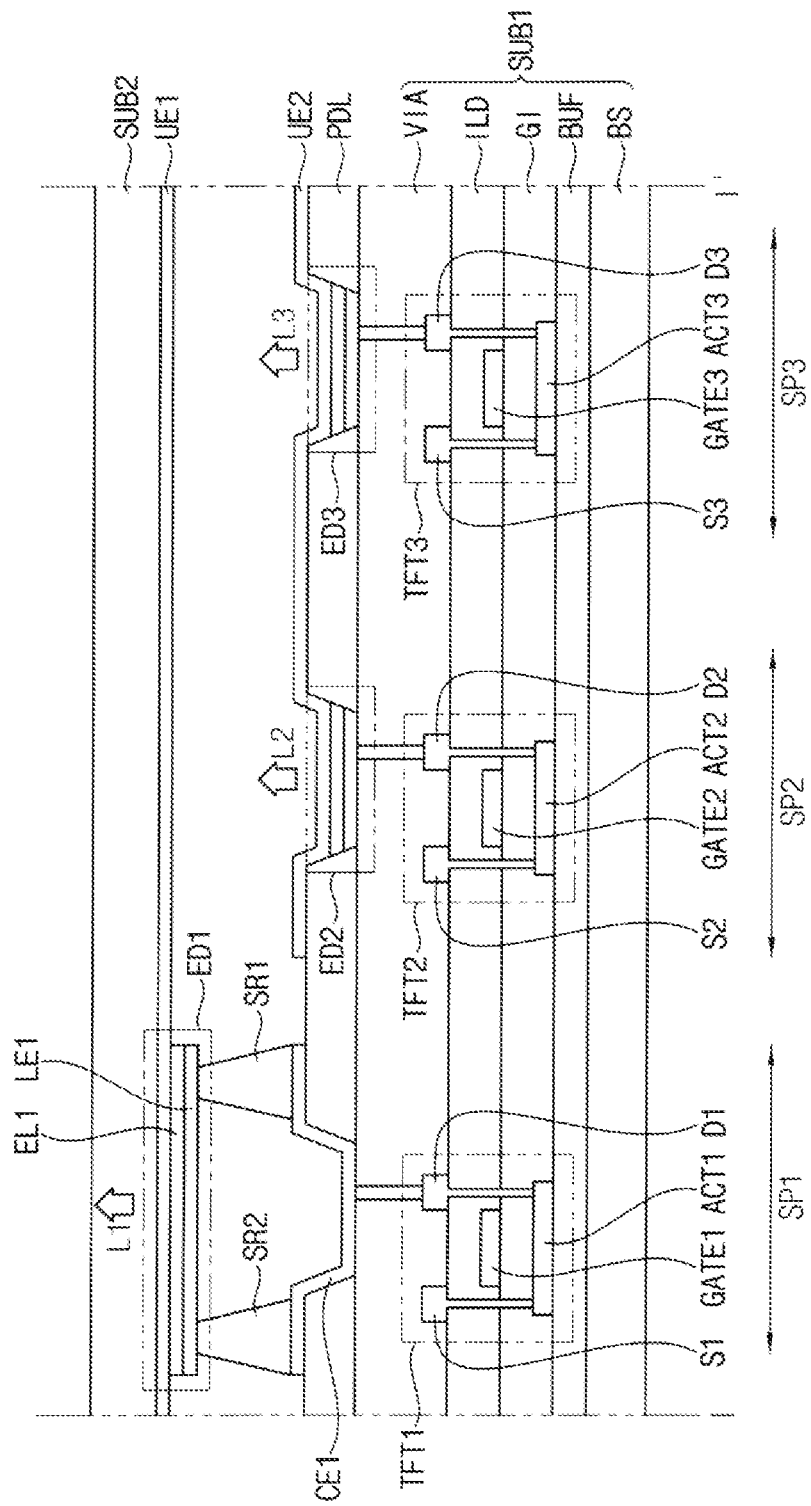
FIG. 6 is a cross-sectional view illustrating an embodiment taken along the line I-I' of FIG. 2.

FIG. 6 is a cross-sectional view illustrating an embodiment taken along the line I-I' of FIG. 2. FIG. 6 may be substantially the same as FIG. 4 except that the second spacer SR2 is further included. Accordingly, repetitive descriptions will be omitted to avoid redundancy.

Referring to FIG. 6, the display device may further include the second spacer SR2. The second spacer SR2 may be disposed on the first connection electrode CE1. In embodiments, the first spacer SR1 and the second spacer SR2 may be disposed at both ends of the first connection electrode CE1. As a result, the first and second spacers SR1 and SR2 may support the second substrate SUB2 on the first substrate SUB1. In addition, a signal transmitted from the first connection electrode CE1 through the first and second spacers SR1 and SR2 may be effectively transmitted to the first light emitting element ED1.

Figure 7:
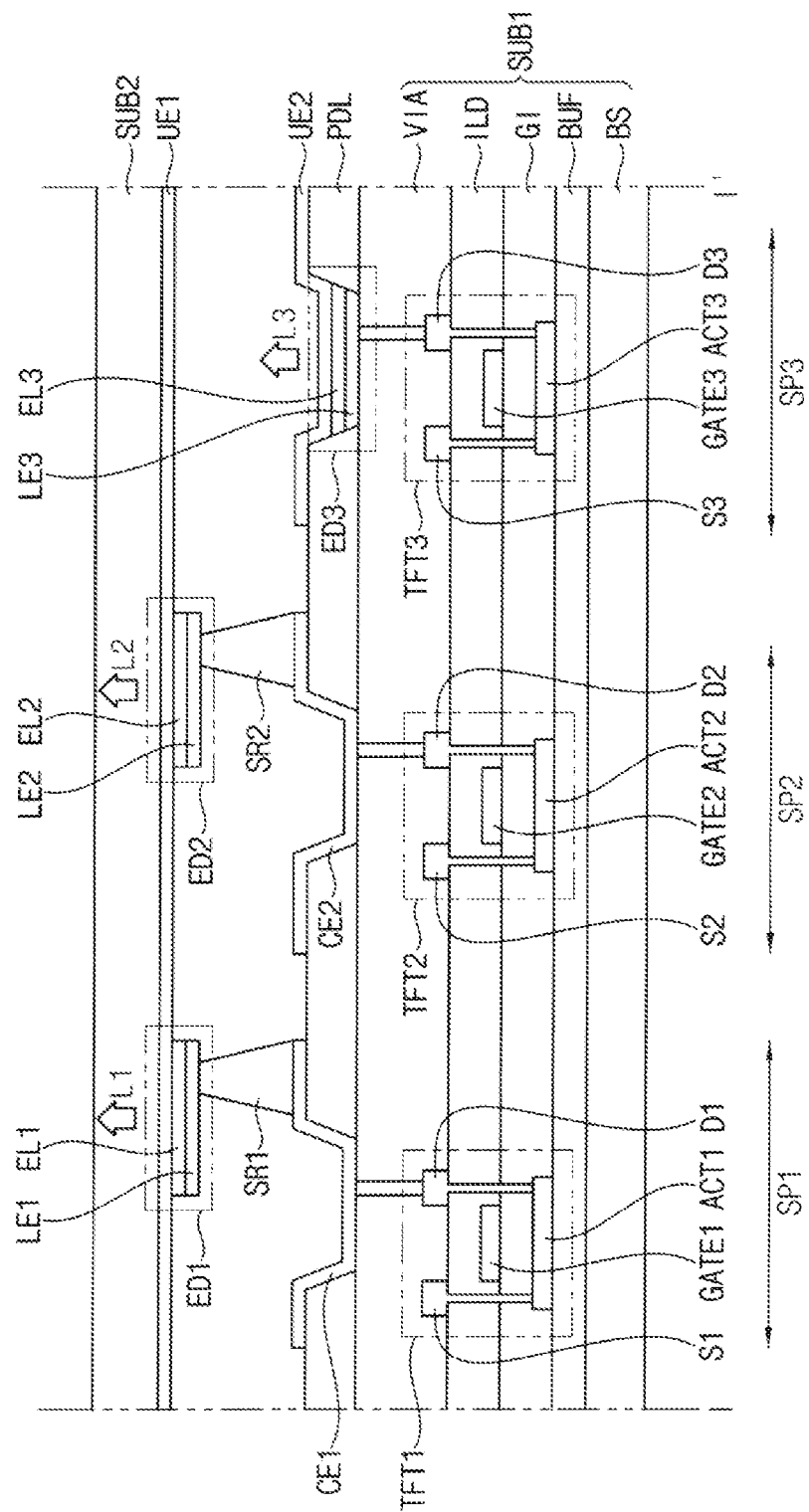
FIG. 7 is a cross-sectional view illustrating an embodiment taken along the line I-I' of FIG. 2.

FIG. 7 is a cross-sectional view illustrating an embodiment taken along the line I-I' of FIG. 2. FIG. 7 may be substantially the same as that of FIG. 4 except for the second sub-pixel SP2. Accordingly, repetitive descriptions will be omitted to avoid redundancy.

Referring to FIG. 7, a second connection electrode CE2 may be disposed on the second transistor TFT2. The second connection electrode CE2 may be connected to the second drain electrode D2 of the second transistor TFT2 through a contact hole. A second spacer SR2 may be disposed on the second connection electrode CE2. The second connection electrode CE2, the second spacer SR2, and the second light emitting element ED2 may be connected by the second spacer SR2.

The second light emitting element ED2 may be disposed on the second spacer SR2. The second light emitting element ED2 may include the second lower electrode LE2, the intermediate layer EL2, and the first upper electrode UE1. Unlike FIG. 4, the upper electrode of the second light emitting element ED2 may be integrally formed with the upper electrode of the first light emitting element ED1.

In this way, the first light emitting element ED1 and the second light emitting element ED2 are disposed above the third light emitting element ED3, so that the first light emitting element ED1 and the second light emitting element ED2 may be disposed adjacent to the third light emitting element ED3 and closer to each other than if all the light emitting elements were are disposed in the same elevational plane. Accordingly, the display device may display a high-resolution image.

In FIG. 2, 4-7, although the first sub-pixel SP1 and the second sub-pixel SP2 are illustrated as being adjacent to each other, and the third sub-pixel SP3 is illustrated as being spaced apart from the first sub-pixel SP1 by the second sub-pixel SP2, this is illustrative and the embodiments are not limited thereto. For example, the first sub-pixel SP1 and the third sub-pixel SP3 may be disposed adjacent to each other, and the second sub-pixel SP2 may be spaced apart from the first sub-pixel SP1 by the third sub-pixel SP3.

For example, the first connection electrode CE1 and the second connection electrode CE2 may be spaced apart by the third light emitting element ED3. Alternatively, the first connection electrode CE1 and the third light emitting element ED3 may be spaced apart by the second connection electrode CE2.

Figure 8:
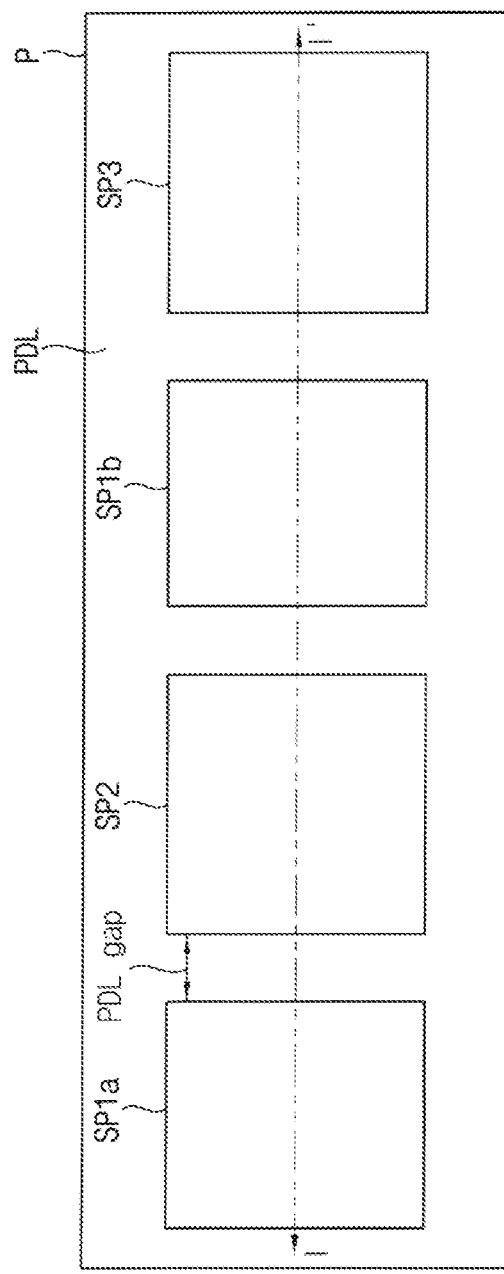
FIG. 8 is a diagram schematically illustrating another embodiment of pixels included in the display device of FIG. 1.

FIG. 8 is a diagram schematically illustrating an embodiment of pixels included in the display device of FIG. 1.

Referring to FIG. 8, each of the plurality of pixels P may include a 1-a-th sub-pixel SP1a, a 1-b-th sub-pixel SP1b, a second sub-pixel SP2, and a third sub-pixel SP3. In embodiments, the 1-a-th sub-pixel SP1a and the 1-b-th sub-pixel SP1b may be smaller in size than the second sub-pixel SP2 and the third sub-pixel SP3.

However, the embodiments are not limited to what is illustrated in FIG. 8, and the 1-a-th sub-pixel SP1a and the 1-b-th sub-pixel SP1b may have substantially the same size as the second sub-pixel SP2 and the third sub-pixel SP3.

The 1-a-th sub-pixel SP1a and the 1-b-th sub-pixel SP1b may emit light of substantially the same color. In embodiments, the sub-pixels SP1a, SP1b, SP2, and SP3 may be arranged in various ways. For example, the pixels SP1a, SP1b, SP2, and SP3 may be spaced apart in one direction as shown in FIG. 2. Alternatively, the pixels SP1a, SP1b, SP2, and SP3 may be arranged in a diamond, pentile, or S-strip structure. That is, the sub-pixels SP1a, SP1b, SP2, and SP3 may be variously arranged within a range capable of displaying an image.

Figure 9:
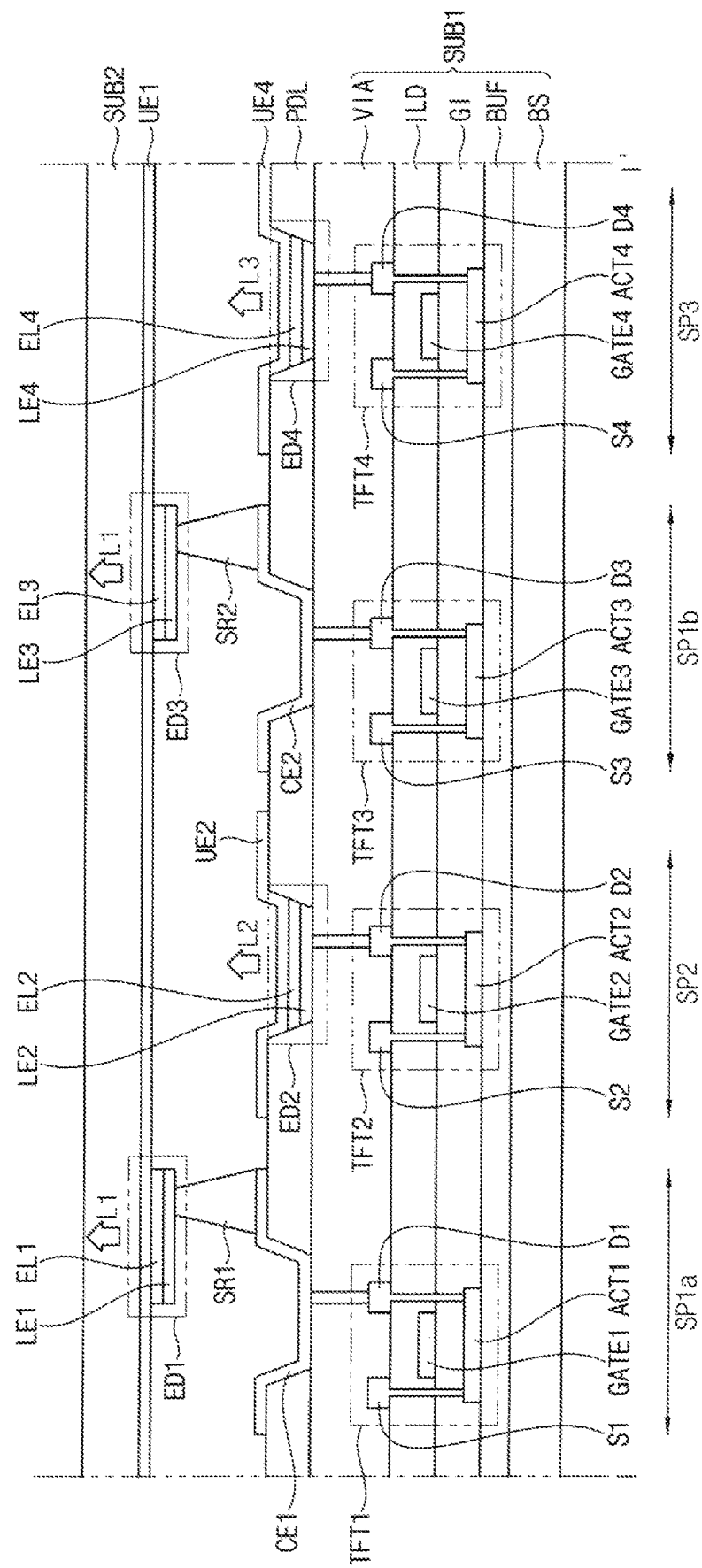
FIG. 9 is a cross-sectional view illustrating an embodiment taken along the line I-I' of FIG. 8.

FIG. 9 is a cross-sectional view illustrating an embodiment taken along the line I-I' of FIG. 8.

Referring to FIG. 9, the display device may include a first substrate SUB1, a second substrate SUB2, a first light emitting element ED1, a second light emitting element ED2, a third light emitting element ED3, a fourth light emitting element ED4, a pixel defining layer PDL, a first connection electrode CE1, and a first spacer SR1.

The first substrate SUB1 may include a base substrate BS, a buffer layer BUF, a gate insulating layer GI, an interlayer insulating layer ILD, a via insulating layer VIA, a first transistor TFT1, and a second transistor. TFT2, a third transistor TFT3, and a fourth transistor TFT4. The first transistor TFT1 may include a first active layer ACT1, a first gate electrode GATE1, a first source electrode S1, and a first drain electrode D1. The second transistor TFT2 may include a second active layer ACT2, a second gate electrode GATE2, a second source electrode S2, and a second drain electrode D2. The third transistor TFT3 may include a third active layer ACT3, a third gate electrode GATE3, a third source electrode S3, and a third drain electrode D3. The fourth transistor TFT3 may include a fourth active layer ACT4, a fourth gate electrode GATE4, a fourth source electrode S4, and a fourth drain electrode D4.

The base substrate BS may include glass, quartz, plastic, or the like. In embodiments, the base substrate BS may include plastic, and thus the display device may have a flexible characteristic.

The buffer layer BUF may be disposed on the base substrate BS. The buffer layer BUF may prevent diffusion of metal atoms or impurities from the base substrate BS to the first to fourth active layers ACT1, ACT2, ACT3, and ACT4.

The first active layer ACT1, the second active layer ACT2, the third active layer ACT3, and the fourth active layer ACT4 may be disposed on the buffer layer BUF. In embodiments, the first active layer ACT1, the second active layer ACT2, the third active layer ACT3, and the fourth active layer ACT4 may include an oxide-based semiconductor material. Alternatively, in embodiments, the first active layer ACT1, the second active layer ACT2, the third active layer ACT3, and the fourth active layer ACT4 may include a silicon-based semiconductor material.

The gate insulating layer GI may be disposed on the buffer layer BUF while covering the first active layer ACT1, the second active layer ACT2, the third active layer ACT3, and the fourth active layer ACT4. The gate insulating layer GI may include silicon oxide ("SiOx"), silicon nitride ("SiNx"), silicon oxynitride ("SiNxOy"), or the like.

The first gate electrode GATE1, the second gate electrode GATE2, the third gate electrode GATE3, and the fourth gate electrode GATE4 may be disposed on the gate insulating layer GI. The first gate electrode GATE1, the second gate electrode GATE2, the third gate electrode GATE3, and the fourth gate electrode GATE4 may include a conductive material.

The interlayer insulating layer ILD may be disposed on the gate insulating layer GI while covering the first gate electrode GATE1, the second gate electrode GATE2, the third gate electrode GATE3, and the fourth gate electrode GATE4. The interlayer insulating layer ILD may include a silicon compound, a metal oxide, or the like.

The first to fourth source electrodes S1, S2, S3 and S4 and the first to fourth drain electrodes D1, D2, D3, and D4 may be disposed on the interlayer insulating layer ILD. The first to fourth source electrodes S1, S2, S3, and S4 and the first to fourth drain electrodes D1, D2, D3, and D4 may include metal, alloy, conductive metal oxide, transparent conductive material, and the like.

Each of the first source electrode S1 and the first drain electrode D1 may be connected to the first active layer ACT1 through a contact hole. Each of the second source electrode S2 and the second drain electrode D2 may be connected to the second active layer ACT2 through a contact hole. Each of the third source electrode S3 and the third drain electrode D3 may be connected to the third active layer ACT3 through a contact hole. Each of the fourth source electrode S4 and the fourth drain electrode D4 may be connected to the fourth active layer ACT4 through a contact hole.

The via insulating layer VIA may be disposed on the insulating layer ILD while covering the first to fourth source electrodes S1, S2, S3, and S4 and the first to fourth drain electrodes D1, D2, D3, and D4. The via insulating layer VIA may include a silicon compound, a metal oxide, or the like. Alternatively, the via insulating layer VIA may be formed of an organic insulating material such as polyimide ("PI").

The pixel defining layer PDL may be disposed on the via insulating layer VIA. The pixel defining layer PDL may include openings in which the first connection electrode CE1, the second connection electrode CE2, the second light emitting element ED2, and the third light emitting element ED3 are disposed. In embodiments, the pixel defining layer PDL may include an organic insulating material.

The first connection electrode CE1 may be disposed in an opening formed by the pixel defining layer PDL. The first connection electrode CE1 may include a metal, an alloy, a conductive metal oxide, a transparent conductive material, or the like. The first connection electrode CE1 may be connected to the first drain electrode D1 of the first transistor TFT1 through a contact hole. The first connection electrode CE1 may receive a signal from the first transistor TFT1.

The second connection electrode CE2 may be disposed in an opening formed by the pixel defining layer PDL. The second connection electrode CE2 may include a metal, an alloy, a conductive metal oxide, a transparent conductive material, or the like. The second connection electrode CE2 may be connected to the third drain electrode D3 of the third transistor TFT3 through a contact hole. The third connection electrode CE3 may receive a signal from the third transistor TFT3.

The second light emitting element ED2 and the fourth light emitting element ED4 may be disposed in an opening formed by the pixel defining layer PDL. The second light emitting element ED2 and the fourth light emitting element ED4 may be disposed on the same layer as the first connection electrode CE1 and the second connection electrode CE2. The second light emitting element ED2 may include a second lower electrode LE2, a second intermediate layer EL2, and a second upper electrode UE2. The fourth light emitting element ED4 may include a fourth lower electrode LE4, a fourth intermediate layer EL4, and a fourth upper electrode UE4.

The second lower electrode LE2 may be connected to the second drain electrode D2 of the second transistor TFT2 through a contact hole. The fourth lower electrode LE4 may be connected to the fourth drain electrode D4 of the fourth transistor TFT4 through a contact hole. Through this, the second light emitting element ED2 and the fourth light emitting element ED4 may directly receive signals from the second transistor TFT2 and the fourth transistor TFT4, respectively.

The first spacer SR1 may be disposed on the first connection electrode CE1. The first spacer SR1 may include a conductive material. In addition, the second spacer SR2 may be disposed on the second connection electrode CE2.

The first light emitting element ED1 may be disposed on the first spacer SR1. The first light emitting element ED1 may include a first lower electrode LE1, a first intermediate layer EL1, and a first upper electrode UE1. The first lower electrode LE1 may be connected to the connection electrode CE1 and the first transistor TFT1 through the first spacer SR1. Through this, the first light emitting element ED1 may receive a signal from the first transistor TFT1.

The third light emitting element ED3 may be disposed on the second spacer SR2. The third light emitting element ED3 may include a third lower electrode LE3, a third intermediate layer EL3, and a first upper electrode UE1. The third lower electrode LE3 may be connected to the second connection electrode CE2 and the third transistor TFT3 through the second spacer SR2. Through this, the third light emitting element ED3 may receive a signal from the third transistor TFT3.

In embodiments, the first light emitting element ED1 and the third light emitting element ED3 may include the same organic light emitting material. Accordingly, the first light emitting element ED1 and the third light emitting element ED3 may emit light of substantially the same color.

In this way, the first light emitting element ED1 and the third light emitting element ED3 are disposed above the second light emitting element ED2 and the fourth light emitting element ED4, when the first light emitting element ED1 and the third light element ED3 are deposited, materials included in the first light emitting element ED1 and the third light element ED3 are not deposited in the openings in which the second light emitting element ED2 and the fourth light emitting element ED4 are disposed. That is, the first to fourth light emitting elements ED1, ED2, ED3, and ED4 may be positioned adjacent to each other and closer to each other than if all the light emitting elements were disposed in the same elevational plane. Accordingly, the display device may display a high-resolution image.

The area between the first upper electrode UE1 and the second upper electrode UE2 may be filled with various materials. In embodiments, between the first upper electrode UE1 and the second upper electrode UE2 may be filled with a transparent insulating material. The transparent insulating material may include glass, transparent resin, or the like. For example, the transparent insulating material may include polyimide ("PI"), polyethylene terephthalate ("PET"), polyethylene naphthalate ("PEN"), and the like. Alternatively, the area between the first upper electrode UE1 and the second upper electrode UE2 may be filled with a transparent adhesive material. For example, the transparent adhesive material may be an acrylic adhesive material. The transparent adhesive material may include an optically transparent resin, an optically transparent adhesive, and the like. However, in embodiments, the space between the first upper electrode UE1 and the second upper electrode UE2 may be filled with air.

The second substrate SUB2 may be disposed on the first upper electrode UE1. In embodiments, the first light emitting element ED1, the second light emitting element ED2, the third light emitting element ED3, and the fourth light emitting element ED4 may be of a top emission type emitting light in a direction in which the second substrate SUB2 is disposed. Accordingly, the second substrate SUB2 may include a transparent material. For example, the second substrate SUB2 may be a transparent substrate such as a glass substrate or a plastic substrate.

The first light emitting element ED1 and the third light emitting element ED3 may emit a first light L1, and the second light emitting element ED2 may emit a second light L2. The fourth light emitting element ED4 may emit third light L3. Each of the first to third lights L1, L2, and L3 may have different colors. Alternatively, the first to third lights L1, L2, and L3 may be lights of substantially the same color.

In embodiments, in the 1-a-th sub-pixel SP1a, the first light emitting element ED1 may be connected to the first transistor TFT1 to emit the first light L1. In the second sub-pixel SP2, the second light emitting element ED2 may be connected to the second transistor TFT2 to emit the second light L2. In the 1-b sub-pixel SP1b, the third light emitting element ED3 may be connected to the third transistor TFT3 to emit the first light L1. In the third sub-pixel SP3, the fourth light emitting element ED4 may be connected to the fourth transistor TFT4 to emit the third light L3.

Display device constructed according to the principles and embodiments of the invention may be used in a computer, a notebook, a mobile phone, a smartphone, a smart pad, a PMP, a PDA, an MP3 player, or the like.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device, comprising:
    a first substrate including a first transistor and a second transistor;
    a second substrate on the first substrate;
    a first connection electrode disposed on the first substrate, and connected to the first transistor;
    a first support disposed on the first connection electrode, and including a conductive material, the first support having a trapezoidal shape in cross-section with a bottom portion of the support wider than a top portion of the first support;
    a first light emitting element disposed on the first support in a first elevational plane; and
    a second light emitting element disposed on the first substrate in a second elevational plane different from the first elevational plane, the second light emitting element comprising an upper electrode and a lower electrode connected to the second transistor;
    a pixel defining layer disposed on the first substrate and including:
        a first opening in which the first connection electrode is disposed, and
        a second opening in which the second light emitting element is disposed such that an upper portion of the first connection electrode and an upper portion of the upper electrode of the second light emitting element are at a same level, wherein
    the bottom portion of the first support directly contacts the first connection electrode, and the top portion of the first support directly contacts the first light emitting element,
    the first light emitting element is disposed on the second substrate and comprises a first upper electrode,
    the second light emitting element disposed on the first substrate comprises a second upper electrode different from the first upper electrode,
    an area between the first upper electrode and the second upper electrode is defined at least in part by the first support, and
    the first support is disposed on the pixel defining layer.

2. The display device of claim 1, wherein the first light emitting element comprises:
    a lower electrode disposed on the first support;
    an intermediate layer disposed on the lower electrode; and
    the upper electrode disposed on the intermediate layer.

3. The display device of claim 1, wherein the first substrate further comprises a third transistor connected to a third light emitting element disposed on the first substrate, and
    the pixel defining layer comprises an opening in which the third light emitting element is disposed.

4. The display device of claim 1, wherein the first support comprises a spacer.

5. The display device of claim 3, wherein the first to third light emitting elements emit light of different colors and each of the second light emitting element and the third light emitting element comprises:
    a lower electrode disposed on the first substrate;
    an intermediate layer disposed on the lower electrode; and
    the upper electrode disposed on the intermediate layer.

6. The display device of claim 3, wherein the first to third light emitting elements are of a top emission type.

7. The display device of claim 1, wherein the first connection electrode and the first light emitting element are electrically connected to each other via the first support.

8. The display device of claim 1, wherein the first substrate further comprises a third transistor connected to a second connection electrode disposed on the first substrate, a second support disposed on the second connection electrode and including a conductive material, and a third light emitting element disposed on the second support, the second support having a trapezoidal shape in cross-section with a bottom portion of the second support wider than a top portion of the second support.

9. The display device of claim 8, wherein the first substrate further comprises a fourth transistor connected to a fourth light emitting element disposed on the first substrate.

10. The display device of claim 9, wherein the first light emitting element and the third light emitting element are disposed in a first elevational plane and spaced apart from each other by the second light emitting element, and the second light emitting element and the fourth light emitting element are disposed in a second elevational plane different from the first elevational plane, and spaced apart from each other by the third light emitting element.

11. The display device of claim 9, wherein the first light emitting element and the third light emitting element emit light of substantially the same color, and the first light emitting element, the second light emitting element, and the fourth light emitting element emit light of different color from each other.

12. The display device of claim 9, wherein the first to fourth light emitting elements are of a top emission type.

13. A display device, comprising:
- a first substrate including a first transistor, a second transistor, and a third transistor;
- a second substrate on the first substrate;
- a first connection electrode disposed directly on the first substrate, and connected to the first transistor;
- a first support disposed on the first connection electrode, and including a conductive material, the first support having a trapezoidal shape in cross-section with a bottom portion of the first support wider than a top portion of the first support;
- a first light emitting element disposed on the first support in a first elevational plane;
- a second connection electrode disposed on the first substrate, and connected to the second transistor;
- a second support disposed on the second connection electrode, and including a conductive material, the second support having a trapezoidal shape in cross-section with a bottom portion of the second support wider than a top portion of the second support;
- a second light emitting element disposed on the second support;
- a third light emitting element disposed on the first substrate in a second elevational plane different from the first elevational plane, the third light emitting element comprising an upper electrode and a lower electrode connected to the third transistor; and
- a pixel defining layer disposed on the first substrate and including:
  - a first opening in which the first connection electrode is disposed,
  - a second opening in which the second connection electrode is disposed, and
  - a third opening in which the third light emitting element is disposed such that at least one of an upper portion of the first connection electrode and an upper portion of the second connection electrode is at a same level as an upper portion of the upper electrode of the third light emitting element, wherein
- the bottom portion of the first support directly contacts the first connection electrode, and the top portion of the first support directly contacts the second light emitting element,
- the bottom portion of the second support directly contacts the second connection electrode, and the top portion of the second support directly contacts the second light emitting element,
- the first light emitting element and the second light emitting element are disposed on the second substrate and comprise a first upper electrode,
- the third light emitting element disposed on the first substrate comprises a second upper electrode different from the first upper electrode,
- an area between the first upper electrode and the second upper electrode is defined at least in part by the first support and the second support, and
- the first support and the second support are disposed on the pixel defining layer.

14. The display device of claim 13, wherein the first and second supports comprise first and second spacers, respectively.

15. The display device of claim 13, wherein the first connection electrode and the second connection electrode are spaced apart from each other by the third light emitting element.

16. The display device of claim 13, wherein the first connection electrode and the third light emitting element are spaced apart from each other by the second connection electrode.

17. The display device of claim 13, wherein the first to third light emitting elements are of a top emission type or emit light of different colors.

18. The display device of claim 13, wherein the first connection electrode and the first light emitting element are electrically connected to each other via the first support, and wherein the second connection electrode and the second light emitting element are electrically connected to each other via the second support.

* * * * *